(12) United States Patent
Mentze et al.

(10) Patent No.: US 7,030,654 B2
(45) Date of Patent: Apr. 18, 2006

(54) LOW VOLTAGE TO EXTRA HIGH VOLTAGE LEVEL SHIFTER AND RELATED METHODS

(75) Inventors: Erik J. Mentze, Moscow, ID (US);
Herbert L. Hess, Moscow, ID (US);
Kevin M. Buck, Pullman, WA (US);
David F. Cox, Tucson, AZ (US)

(73) Assignee: Idaho Research Foundation, Inc., Moscow, ID (US)

( * ) Notice: Subject to any disclaimer, the term of this patent is extended or adjusted under 35 U.S.C. 154(b) by 56 days.

(21) Appl. No.: 10/920,630

(22) Filed: Aug. 18, 2004

(65) Prior Publication Data
US 2005/0040852 A1    Feb. 24, 2005

Related U.S. Application Data

(60) Provisional application No. 60/499,060, filed on Aug. 22, 2003.

(51) Int. Cl.
*H03K 19/0175* (2006.01)

(52) U.S. Cl. .............................. 326/83; 326/68; 326/86

(58) Field of Classification Search ............ 326/63–68, 326/81–89
See application file for complete search history.

(56) References Cited

U.S. PATENT DOCUMENTS

| | | | | |
|---|---|---|---|---|
| 5,684,415 A | * | 11/1997 | McManus | 326/81 |
| 5,786,711 A | * | 7/1998 | Choi | 326/83 |
| 5,896,045 A | * | 4/1999 | Siegel et al. | 326/81 |
| 5,995,010 A | * | 11/1999 | Blake et al. | 340/653 |
| 6,040,708 A | * | 3/2000 | Blake et al. | 326/33 |
| 6,184,716 B1 | * | 2/2001 | Depetro et al. | 326/83 |
| 6,487,687 B1 | * | 11/2002 | Blake et al. | 714/724 |

* cited by examiner

*Primary Examiner*—Don Le
(74) *Attorney, Agent, or Firm*—Lee & Hayes, PLLC

(57) ABSTRACT

Shifter circuits comprise a matched translation stack comprising at least first and second stacks each of which comprising multiple transistors. The matched translation stack is configured to provide a primary logic level shift between a voltage level away from which a shift is desired ($V_{ddL}$) and a voltage level to which the shift is desired ($V_{ddH}$). One or more high voltage buffer stages are provided, at least one of which being connected with and biased by the matched translation stack. At least one high voltage buffer stage comprises multiple transistors arranged in a transistor stack that is biased by the first stack of the matched translation stack, and is connected to receive an input supplied by the second stack of the matched translation stack. The high voltage buffer stage also comprises an inverter that drives an output stage which is also driven by a low voltage buffer stage.

19 Claims, 9 Drawing Sheets

LOW VOLTAGE TO EXTRA HIGH VOLTAGE LEVEL SHIFTER AND RELATED METHODS

RELATED APPLICATION

This application claims priority to U.S. Provisional Application Ser. No. 60/499,060, filed on Aug. 8, 2003, the disclosure of which is incorporated by reference.

TECHNICAL FIELD

This invention relates to voltage level shifters and, more particularly, to low voltage to high voltage level shifters.

BACKGROUND

Historically, the primary mode of reducing power consumption in electronic circuits has been to aggressively scale down the power supply voltage. This power supply reduction follows naturally for CMOS technologies since the Moore's Law scaling of processes into the nanometer range has resulted in gate oxide breakdown voltages on the order of 3.3 volts, 2.5 volts, 1.8 volts and lower. While effective in mitigating power consumption, this reduced breakdown voltage places significant limitations on the interconnection of these devices with other higher voltage systems. Such high voltage systems include 5 volt Legacy hardware and 28 volt aerospace hardware.

A typical solution to this problem is to add intermediate control circuitry between the integrated circuit and the external high voltage system. In this manner the system logic is performed at efficient low voltage levels, while the output is driven from an external source. This solution is viable, however the size and complexity of the overall design is increased considerably. A second typical solution is to use an integrated circuit process that is capable of laying down thick as well as thin gate oxides. This enables low voltage as well as high voltage transistors to be laid down on the same substrate. However, this alteration of the original fabrication process is prohibitively expensive in many applications. Further, both of these solutions suffer from another problem in that something external to the desired integrated circuit fabrication process must be added to the final design. In extreme environment applications (i.e. high temperature, low temperature, high radiation, high pressure, corrosive, etc.) this is not always acceptable. The integrated circuit fabrication process has been chosen for its temperature, radiation, and pressure characteristics. By adding external devices or altering the fabrication process these required characteristics can be lost.

This invention arose out of a need to develop a low voltage to high voltage logic level shifters that can be fully integrated onto the same substrate as the low voltage logic circuitry that controls it. That is, without altering the fabrication process in any way, this invention creates a means by which to control high voltage signals that exceed the breakdown voltage of the process used for fabrication.

SUMMARY

In one embodiment, a shifter circuit comprises a matched translation stack comprising at least first and second stacks each of which comprising multiple transistors. The matched translation stack is configured to provide a primary logic level shift between a voltage level away from which a shift is desired ($V_{ddL}$) and a voltage level to which the shift is desired ($V_{ddH}$). One or more high voltage buffer stages are provided, at least one of which being connected with and biased by the matched translation stack. At least one high voltage buffer stage comprises multiple transistors arranged in a transistor stack having a plurality of intermediate nodes connecting individual transistors along the stack. The transistor stack is biased by the first stack of the matched translation stack, and is connected to receive an input supplied by the second stack of the matched translation stack. The high voltage buffer stage also comprises an inverter comprising multiple inputs and an output. Individual inverter inputs are connected to a respective intermediate node of the transistor stack. A low voltage buffer stage has an input and an output, where the input is connected to an input voltage $V_{in}$, and is connected between the voltage level away from which the shifted is desired ($V_{ddL}$) and a lower voltage. An output buffer stage is driven by the outputs of the high voltage buffer stage and the low voltage buffer stage.

DETAILED DESCRIPTION

Overview

The level shifter circuit described below is particularly well-suited for use in connection with low voltage, deep sub-micron processes, e.g. SOI processes. It is to be appreciated and understood, however, that the described circuit is not limited to SOI contexts. Rather, other types of fabrication processes can be utilized to implement the illustrated circuits, e.g. bulk processes, non-silicon processes, and others, as will be appreciated by the skilled artisan. The circuit about to be described carries with it advantages that include the ability to readily lend itself to cascading of multiples of this device, to shift any input signal up to any control level.

Additionally, it is to be appreciated and understood that the scope of this design is not restricted to shifting to only one level at a time. Rather, the level shifter circuit can be configured such that multiple levels can be shifted to simultaneously. Further advantages are achieved insofar as the circuit about to be described has a fairly simplified layout.

In at least some embodiments, by not using differential pairs, or any special devices that have higher than normal breakdown voltages, the consistency of this device across a wide process deviation can be ensured.

As well, it is to be appreciated and understood that the operation of this design is not restricted by the physical breakdown voltage limitations imposed by the process used for fabrication. That is, these devices are capable of shifting and controlling logic levels that exceed the rated breakdown voltage of the process used for fabrication. This invention can be implemented, by way of example and not limitation, in such a way as to generate 28 volt output signals, while having been fabricated in a process that breaks down at only 2.5 volts.

Figure 1:
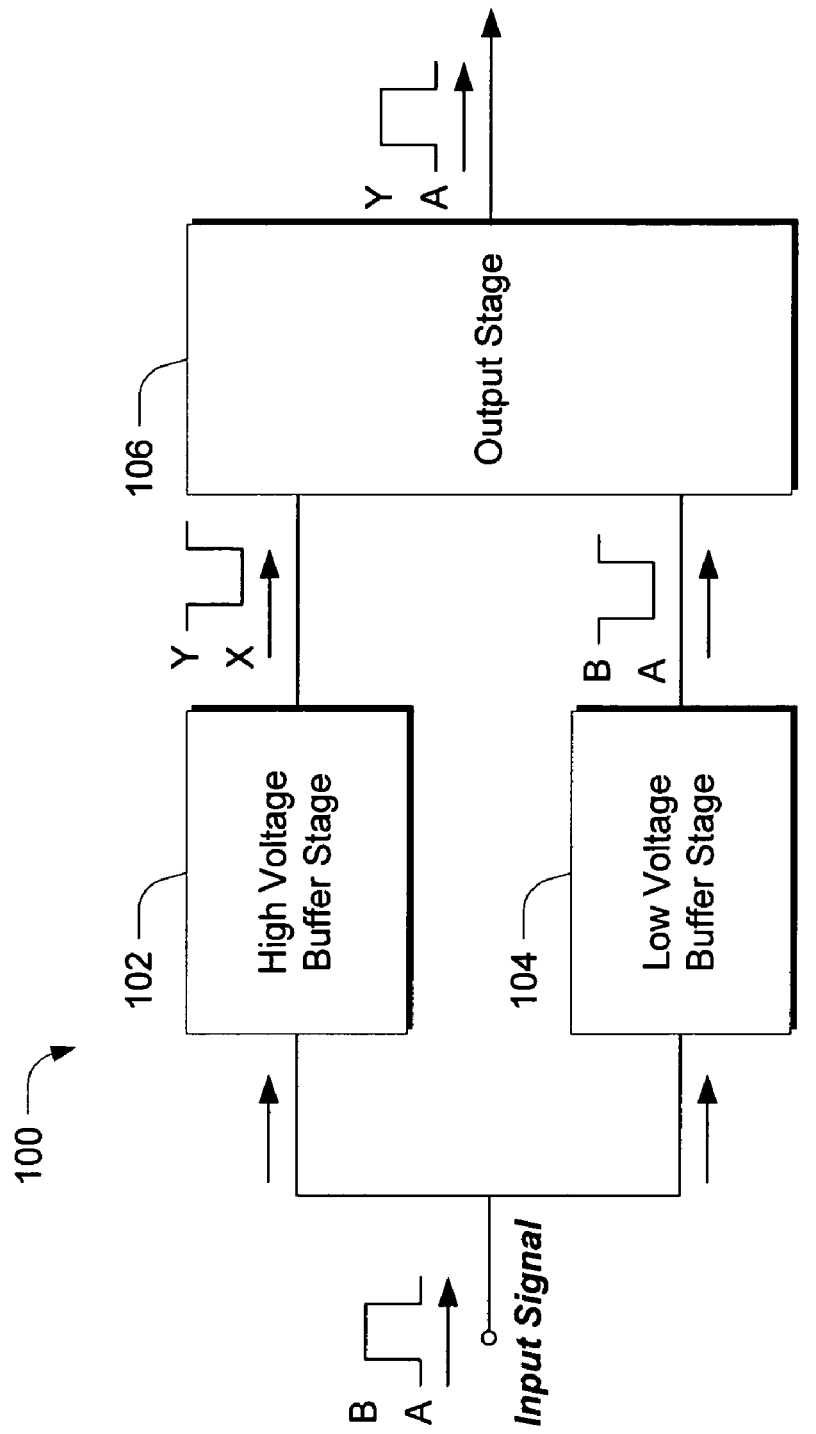
FIG. 1 is a high block diagram of a circuit in accordance with one embodiment.

Turning attention now to FIG. 1, an exemplary block diagram of a low voltage to high voltage level shifter circuit, in accordance with one embodiment, is shown generally at 100. Circuit 100 comprises, in this example, a high voltage buffer stage 102, a low voltage buffer stage 104 and an output stage 106.

The high and low voltage buffer stages 102, 104 receive an input signal, generate control signals, and drive output stage 106. Output stage 106 then drives a load at the output level for which the designed is configured. More specifically, in this example, the input signal resides between two arbitrary logic levels designated as A and B, and high voltage buffer stage 102 performs the logic level shifting up to the level for which the circuit is designed—in this example level Y Low voltage buffer stage 104 is utilized as an inverter, as will be appreciated by the skilled artisan. As will be discussed below, low voltage buffer stages can be cascaded to meet certain timing requirements that are driven by the high voltage buffer stage, as well as to achieve a signal orientation to match the orientation of the high voltage buffer, as will be appreciated by the skilled artisan.

Output stage 106, in this example, is configured as an inverter that is driven by two separate control signals—the high voltage control signal produced by the high voltage buffer stage 102, and the low voltage control signal produced by the low voltage control stage 104—to produce the desired high voltage output signal or logic level.

Stages 102, 104 and 106 can take on differing forms, depending on the particular environments in which they are employed, as will be discussed below.

Exemplary Low Voltage to High Voltage Level Shifter Circuit

Figure 2:
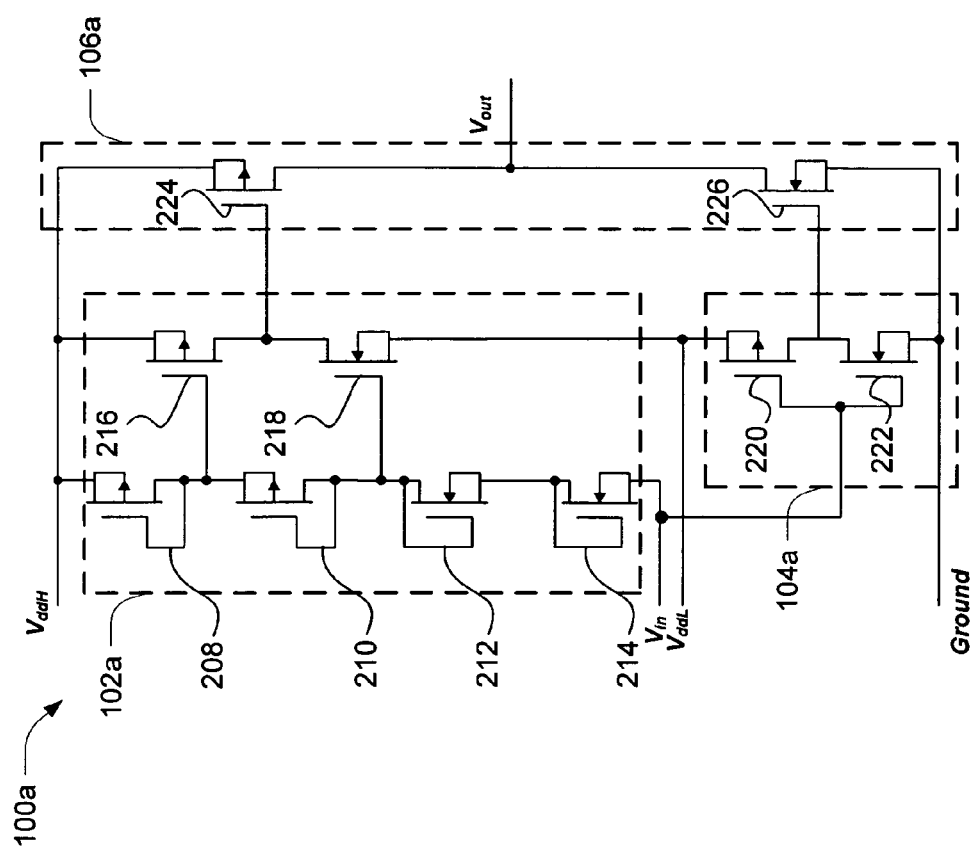
FIG. 2 is a schematic diagram that illustrates the circuit of FIG. 1 in accordance with one specific implementation example.

FIG. 2 shows an exemplary low voltage to high voltage level shifter circuit 11 in accordance with one embodiment, generally at 100a. Like numerals from the FIG. 1 example have been used where appropriate, with differences being indicated with the suffix "a". Accordingly, circuit 100a comprises a high voltage buffer stage 102a, a low voltage buffer stage 104a and an output stage 106a.

High voltage buffer stage 102a comprises, in this example, transistors in the form of MOSFETs 208, 210, 212, 214, 216 and 218. In this particular example, each transistor has its source tied to the bulk contact. This is because the circuit is implemented using an SOI process. As noted above, however, such need not necessarily be the case. Hence, in other implementations, the source/bulk connection need not be made.

In this particular implementation, transistors 208, 210 and 216 are p-channel devices, where 208 and 210 have their gates tied to their respective drains. Similarly, transistors 212, 214 and 218 are n-channel devices, where 212 and 214 have their gates tied to their respective drains. Such gate-drain arrangement, as will be appreciated by the skilled artisan, constitutes a diode connection. Transistors 208, 210, 212 and 214 constitute a transistor stack having intermediate nodes interconnecting the transistors, as will become apparent.

Transistor 208 is connected by its drain to the source of transistor 210. The connection between these transistors constitutes an intermediate node which, in this example, is connected to the gate of transistor 216. Transistor 210 has its drain connected to the drain of transistor 212 which constitutes another intermediate node which, in this example, is connected to the gate of transistor 218. Transistor 212 has its source connected to the drain of transistor 214 which, in turn, constitutes another intermediate node.

The sources of transistors 208 and 216 are tied to $V_{ddH}$, which is the level to which the circuit is shifting. The source of transistor 214 is tied to input signal $V_{in}$, which is used to selectively turn transistors 216 and 218 on and off as will be discussed below. The source of transistor 218 is tied to $V_{ddL}$, which is the level from which the circuit is shifting away.

The output of the high voltage buffer stage, taken from the node connecting the drains of transistors 216, 218 is connected to the gate of transistor 224 in the output stage 106a.

Low voltage buffer stage 104a comprises, in this example, transistors 220 and 222. The source of transistor 220 is connected to the source of transistor 218 in the high voltage buffer stage 102a which, in turn, is tied to $V_{ddL}$, the level away from which the shift occurs. The gates of transistors 220 and 222 are tied together and connected to $V_{in}$. The output of the low voltage buffer stage 104a is connected to the gate of transistor 226 in the output stage 106a. The output of output stage 106a, $V_{out}$, is taken from the node connecting the drains of transistors 224 and 226 and is used to drive a desired load.

In Operation

In operation, when the input signal $V_{in}$ rises, it causes all of the intermediate node voltages of the transistor stack (i.e. transistors 208, 210, 212 and 214) to rise. Alternately, when the input signal $V_{in}$ falls, it causes all of the intermediate node voltages of the transistor stack to fall. This rising and falling of the node voltages generates control signals that selectively turn transistors 216 and 218 on and off. Specifically, when $V_{in}$ is high, all of the intermediate node voltages rise high enough such that transistor 216 is turned off and transistor 218 is turned on. Thus, the voltage of the intermediate node between transistors 210 and 212 is used to drive transistor 218 which, in turn, is used to drive transistor 224 in the output stage 106. When $V_{in}$ is low, on the other hand, the intermediate node voltages of the voltage stack move downward such that transistor 216 is turned on and transistor 218 is turned off. Thus, the voltage of the intermediate node between transistors 208 and 210 is used to drive transistor 216 which, in turn, is used to drive transistor 224 in the output stage 224. Because the high voltage buffer stage 102a is tied between $V_{ddH}$ and $V_{ddL}$, the output of the common drain connection between transistors 216, 218 is a pulse that is between $V_{ddL}$ and $V_{ddH}$, the level being shifting to.

Accordingly, the transistor stack of transistors 208, 210, 212 and 214 effectively constitutes an input voltage divider which is tied between the input signal $V_{in}$ and $V_{ddH}$, the level being shifted to. Transistors 216 and 218 constitute an inverting buffer which is driven by two of the intermediate nodes of the voltage divider. Hence, this stage generates an inverted high voltage control signal which is provided to output buffer 106a.

Low voltage buffer stage 104a, in this embodiment, is comprised of a single inverting buffer, which is driven by the input voltage $V_{in}$. This inverting buffer generates an inverted low voltage control signal which, in turn, drives transistor 226 of the output buffer stage 106a.

In accordance with this embodiment, the output buffer stage 106a rectifies the inverted control signals from the high voltage buffer stage 102a and low voltage buffer stage 104a to the original signal orientation, and drives the high voltage output level $V_{out}$ with the required current capability. It is to be appreciated and understood that the described embodiment is not to be limited to any one low voltage level or any one high voltage level. Rather, it can be scaled to arbitrarily high levels and arbitrarily low levels.

Uses of the above-described circuit include, by way of example and not limitation, providing an interface between low voltage integrated circuit technologies and other integrated circuit technologies that operate at higher logic levels. As stated previously, these levels are not fixed, but can vary as application is needed.

Exemplary Cascaded Embodiment

In another embodiment, multiple high voltage buffer stages can be cascaded together to achieve much higher shift up levels. That is, by cascading the high voltage buffers described above, as shown in FIG. 3, significantly higher levels can be achieved.

Figure 3:
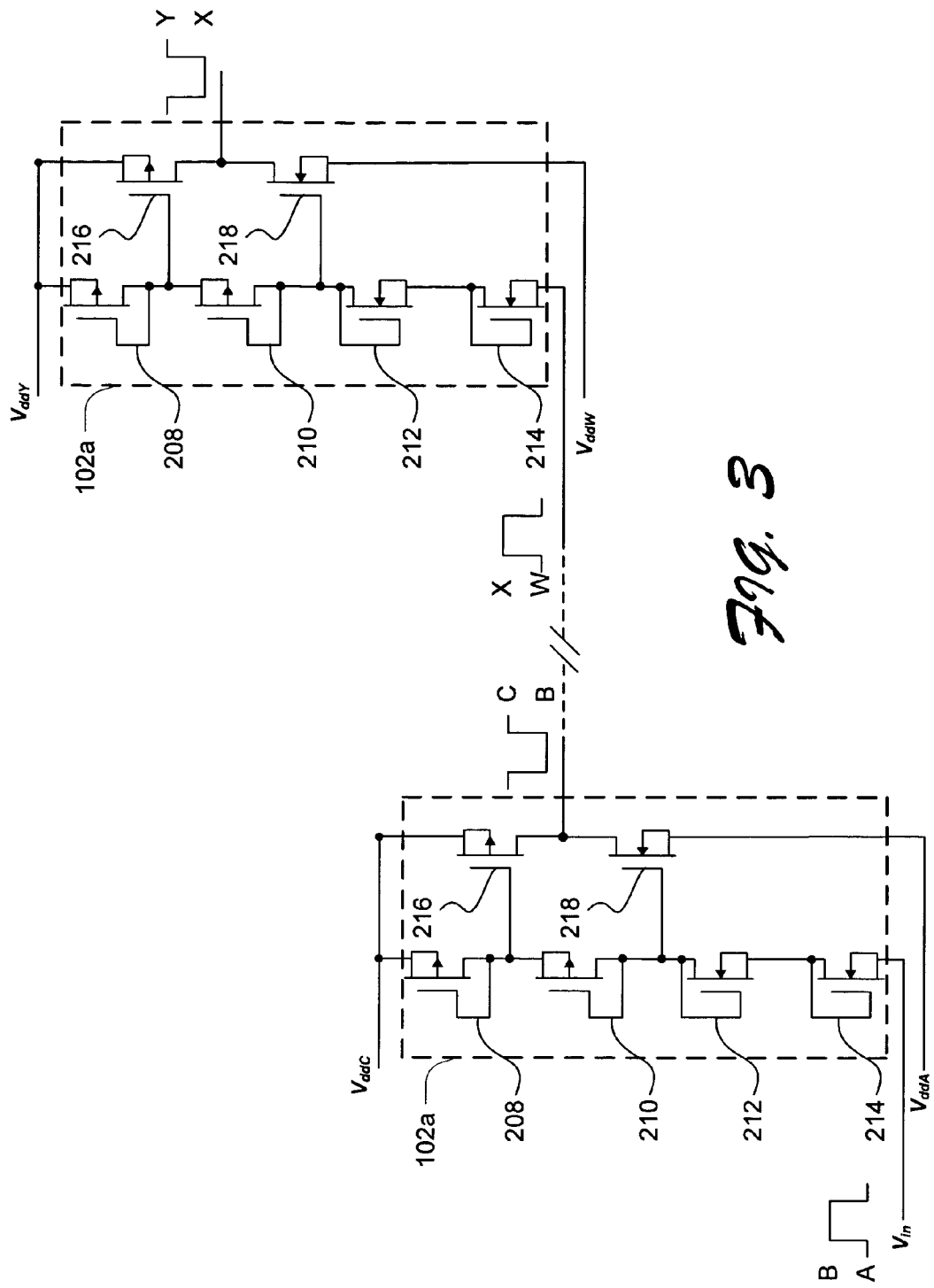
FIG. 3 is a schematic diagram that illustrates the cascading of the high voltage buffer of FIG. 2 in accordance with one embodiment that achieves higher shifting levels.

In the illustrated and described embodiment, the primary level shifting is performed by the high voltage buffer stage 102a. By cascading multiples of this stage, higher control signals can be obtained. That is, as shown in FIG. 3, by tying the output of the first stage, to the input of the second, the input level can be successively shifted up to any desired control level. For example, if the input is a pulse from A–B volts, the first stage can shift this signal up to a pulse from B–C volts, the second stage can shift the signal up to a pulse from C–D volts, and this process can be continued on as far as the specific application requires. These intermediate levels are set by the bias voltages shown in FIG. 3. By adjusting these to the desired values, any shift point can be achieved.

Figure 4:
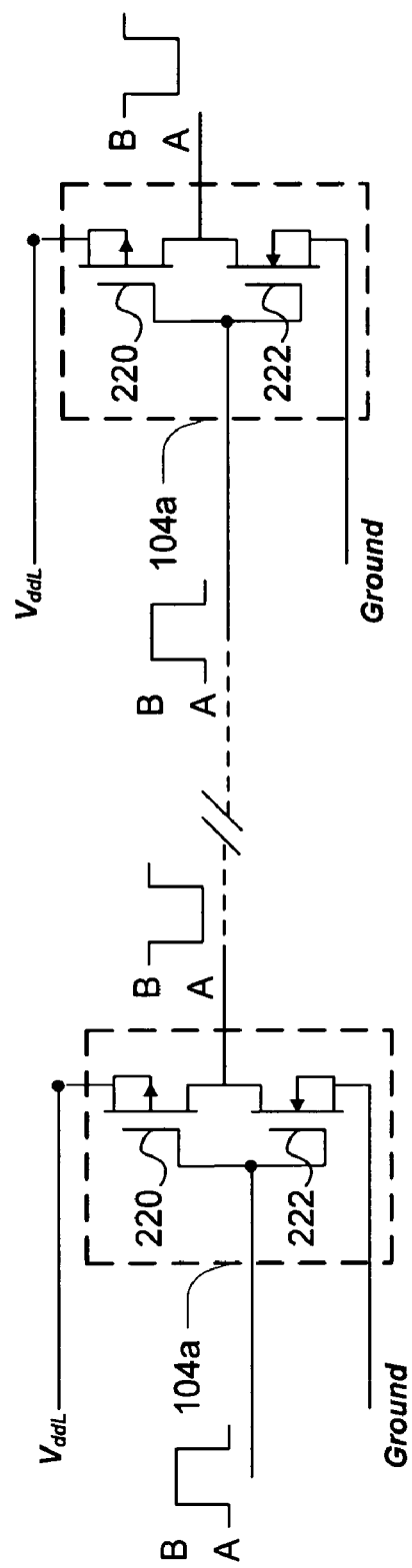
FIG. 4 is a schematic diagram that illustrates the cascading of the low voltage buffer in accordance with one embodiment to achieve higher shifting levels.

The low voltage buffer stage performs the same operation as the low voltage buffer stage does in the non-cascaded embodiment. Here, however, it fulfills a second role. By cascading multiple buffers, as shown in FIG. 4, it ensures that the low voltage control signal and the high voltage control signal both arrive at the output buffer at the same time. That is, as more and more high voltage buffer stages are cascaded together, more of a propagation delay is introduced. Hence, if the output of the high voltage buffer stage significantly lags the output of the low voltage buffer stage, logical errors can be introduced. Accordingly, by cascading low voltage buffer stages, propagation delays introduced by cascaded high voltage buffer stages can be matched and hence, the risk of logical errors mitigated.

In addition, in some instances a significantly large MOSFET might be used in the output buffer stage. In this case, the output buffer might then require a drive circuit. For example, if one attempts to drive several milliamps, e.g., 500 mA, a large MOSFET on the order of 1000 microns×1000 microns might be required. In this situation, the output buffer stage could not be driven by the inverter configuration shown for the outputs of the high voltage and low voltage buffer stages 102a, 104a respectively. Because the output of the high voltage buffer stage is between $V_{ddH}$ and $V_{ddL}$, more standard inverters can be tied between voltage buffers and the output stage to effectively provide a driver. That is, the design described above lends itself readily to driving large loads.

Figure 5:
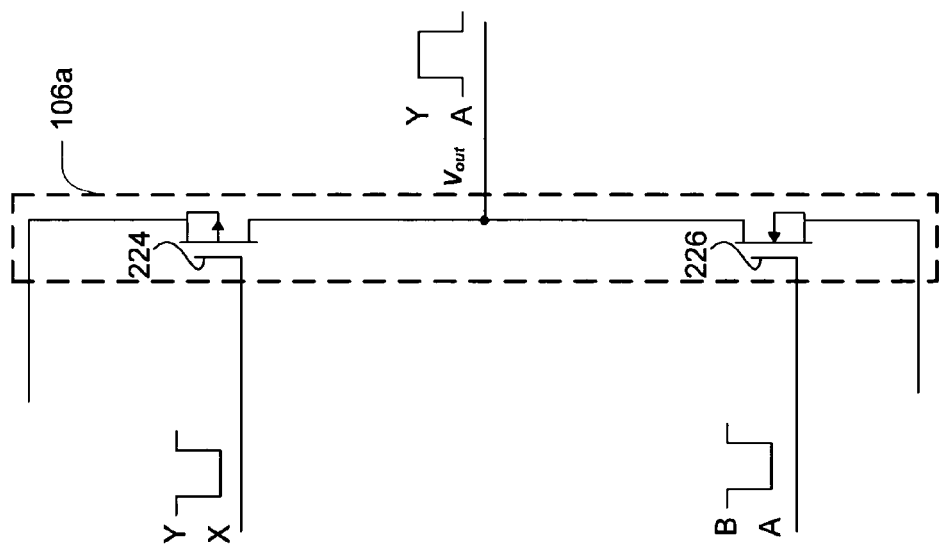
FIG. 5 is a schematic diagram that illustrates the output stage of the cascaded circuit in accordance with one embodiment.

FIG. 5 illustrates the operation of the output buffer stage. Here, two inverted control signals generated by the high and low voltage buffer stages 102a, 104a respectively, are tied to the output stage as shown in FIG. 5. The output stage then generates the final signal that the circuit has been designed to generate.

Figure 6:
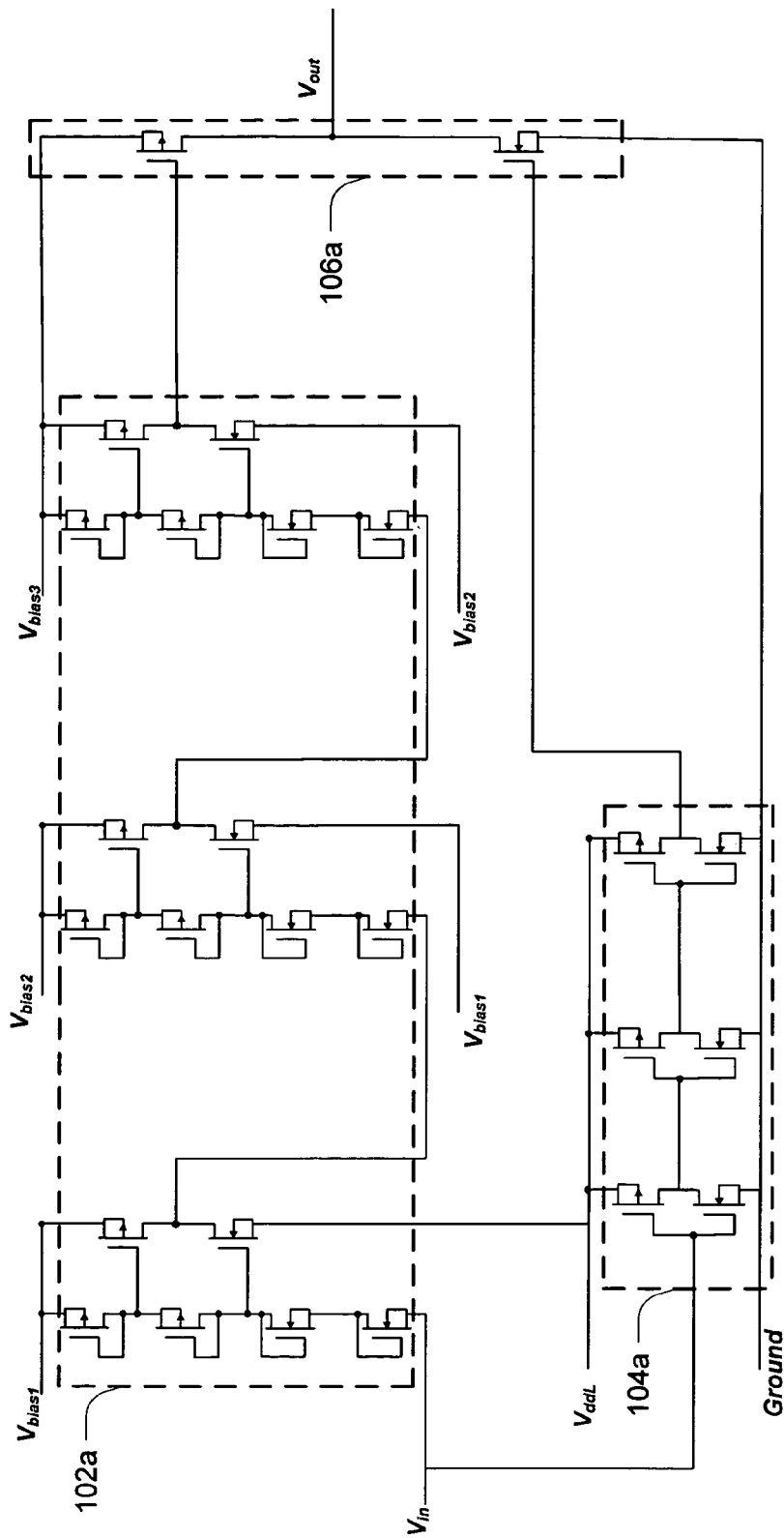
FIG. 6 is a schematic diagram that shows a specific exemplary cascaded circuit that utilizes the circuits of FIGS. 3–5.

FIG. 6 is a schematic diagram that shows a specific exemplary cascaded circuit that utilizes the circuits of FIGS. 3–5.

Exemplary Low Voltage to Extra High Voltage Level Shifter Circuit

Figure 7:
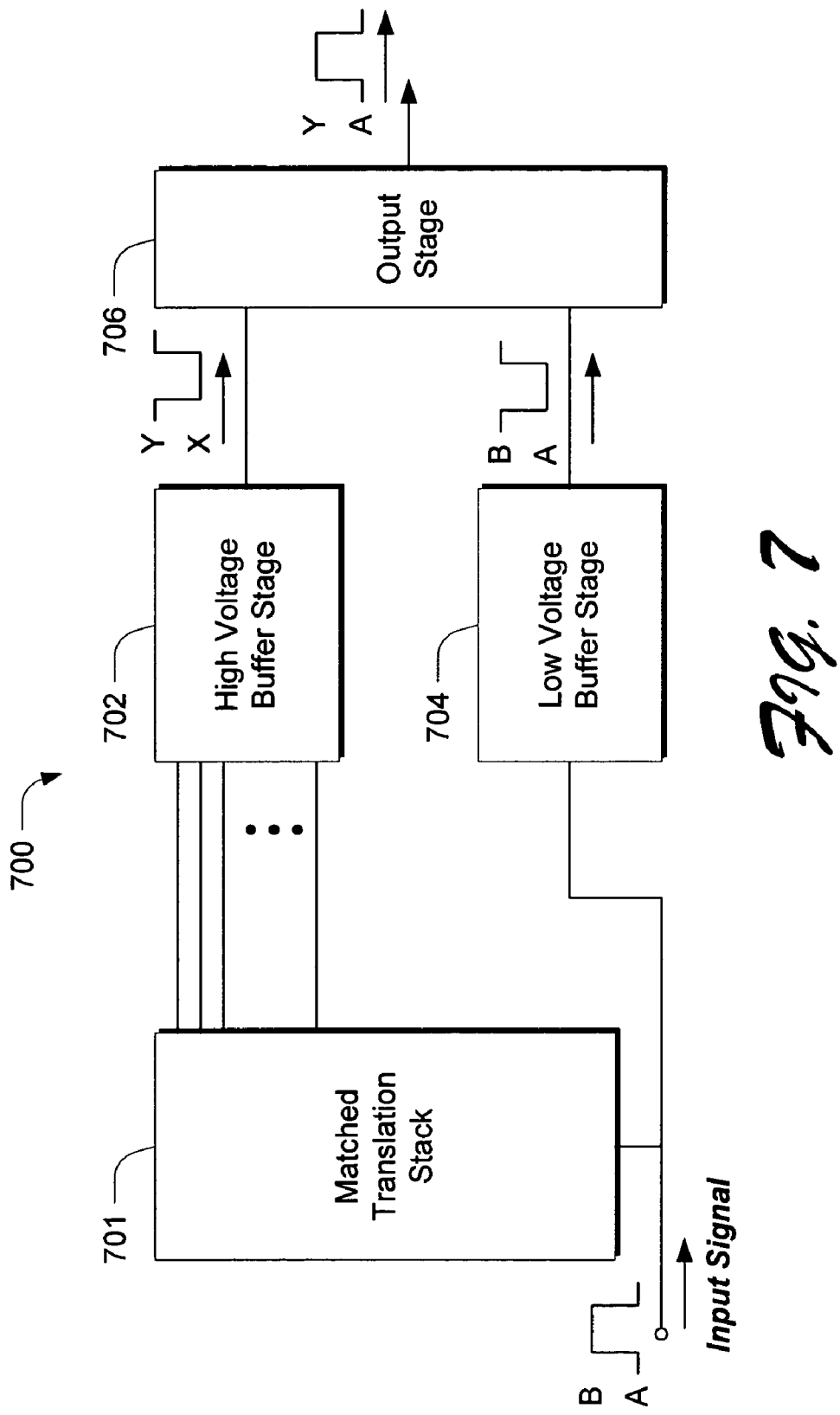
FIG. 7 is a block diagram of a circuit in accordance with one embodiment.

FIG. 7 shows a block diagram of an exemplary low voltage to extra high voltage level shifter circuit in accordance with one embodiment, generally at 700. In the illustrated and described embodiment, circuit 700 comprises a matched translation stack 701, a high voltage buffer stage 702 coupled to receive the output of the translation stack 701, a low voltage buffer stage 704 and an output stage 706 coupled with the high voltage and low voltage buffer stages 702, 704. As will be appreciated from the discussion below, circuit 700 adapts concepts presented in the above-mentioned low to high voltage level shifter.

In this example, matched translation stack 701 is used to provide biasing for high voltage buffer stage 702, and as well as to provide the primary logic level translation. After the primary logic level translation or upward shift, high voltage buffer stage 702 performs a secondary or final manipulation of the logic level to the desired level. The outputs of the high and low voltage buffer stages are then provided to output stage 706 for processing that is similar to that described above.

Figure 8:
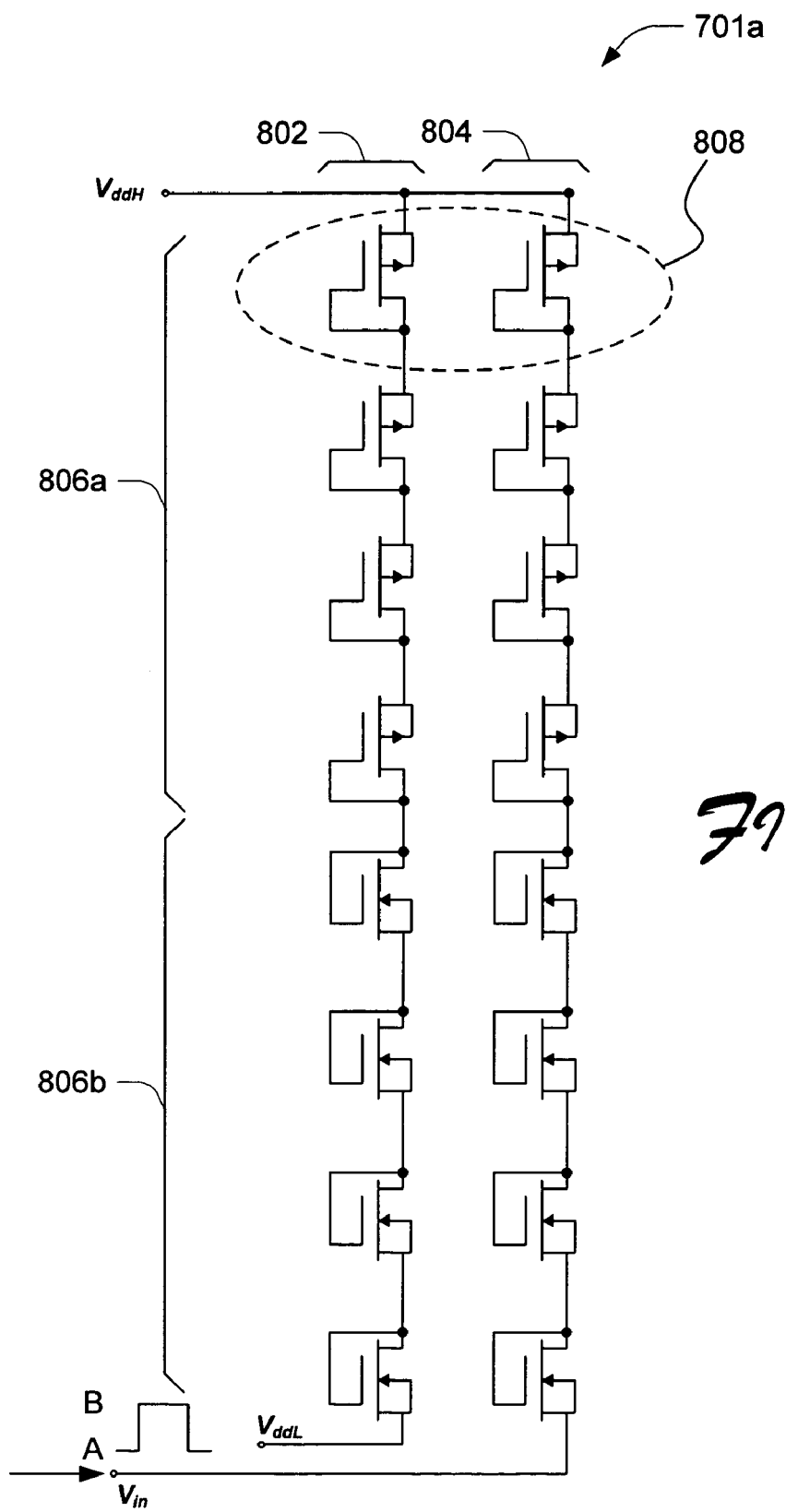
FIG. 8 is a schematic diagram that illustrates an exemplary matched translation stack in accordance with one embodiment.

FIG. 8 shows an exemplary matched translation stack in accordance with one embodiment, generally at 701a. There, matched translation stack 701a comprises first and second stacks 802, 804 respectively, each having a plurality of transistors. In this example the transistors of each stack comprise diode-connected MOSFETs. Additionally, each stack comprises a plurality of p-channel devices 806a, and a plurality of n-channel devices 806b. The number of devices in each stack is dependent upon the process used and the desired shift level, as will be appreciated by the skilled artisan.

In this example, first stack 802 is tied between $V_{ddH}$ (the level being shifted to) and $V_{ddL}$ (the level being shifted away from), and is used to bias high voltage buffer stage 702 (FIG. 7). Second stack 804 is tied between $V_{ddH}$ and the input signal $V_{in}$. The matched input voltage translation stack receives the input signal, translates it to a higher level, and drives high voltage buffer stage 702.

With respect to the matched nature of stacks 802, 804, consider the following. When an integrated circuit is fabricated, process deviations can occur that cause devices manufactured on the same wafer to vary insofar as their dimensions and/or operational parameters are concerned. One can, however, take steps to mitigate the effects of process deviations. For example, many times, devices that are fabricated in close proximity to one another will not vary as much in their characteristics as devices that reside across the wafer from one another. Thus, the way that one chooses to lay out a circuit can affect the performance characteristics of the subsequently created devices. As such, and in accordance with one embodiment, when circuit 701a is manufactured, it is laid out in a manner that is directed to reducing the process-induced deviations as between the individual transistors. Specifically, stacks 802 and 804 are laid out to be in close proximity with one another. Additionally, in at least some embodiments, individual transistors of the stacks can be interdigitated with one another to attempt to ensure that each transistor set (i.e. one transistor from stack 802 and its corresponding transistor from stack 804—such as transistor set 808) co-vary. In this manner, each of the transistors of a transistor set co-varies and, as a result, stacks 802, 804 are matched.

Now consider the operation of circuit 701a. Specifically, when the input signal $V_{in}$ is high, the input signal is at the same level as $V_{ddL}$. Hence, this produces respective voltage potentials at individual corresponding intermediate nodes that are identical or at least very very close. Corresponding intermediate nodes comprise an intermediate node in stack 802, and an intermediate node in stack 804 that occurs, in the FIG. 8 illustration, at the same elevational level as the intermediate node in stack 802.

For example, in this state, the intermediate nodes between each transistor of transistor set 808 and the associated transistors just below are at the same potential. Additionally, other corresponding intermediate nodes in stacks 802, 804 are at the same potential, although the potentials of corresponding intermediate nodes vary relative to one another as one moves elevationally along each stack.

When $V_{in}$ is low, the potential drop across stack 802 is different from the potential drop across stack 804. Hence, the potentials of the corresponding intermediate nodes in the stacks are different which, in turn, allows control signals to be generated and used by the high voltage buffer stage 702 (FIG. 7).

Figure 9:
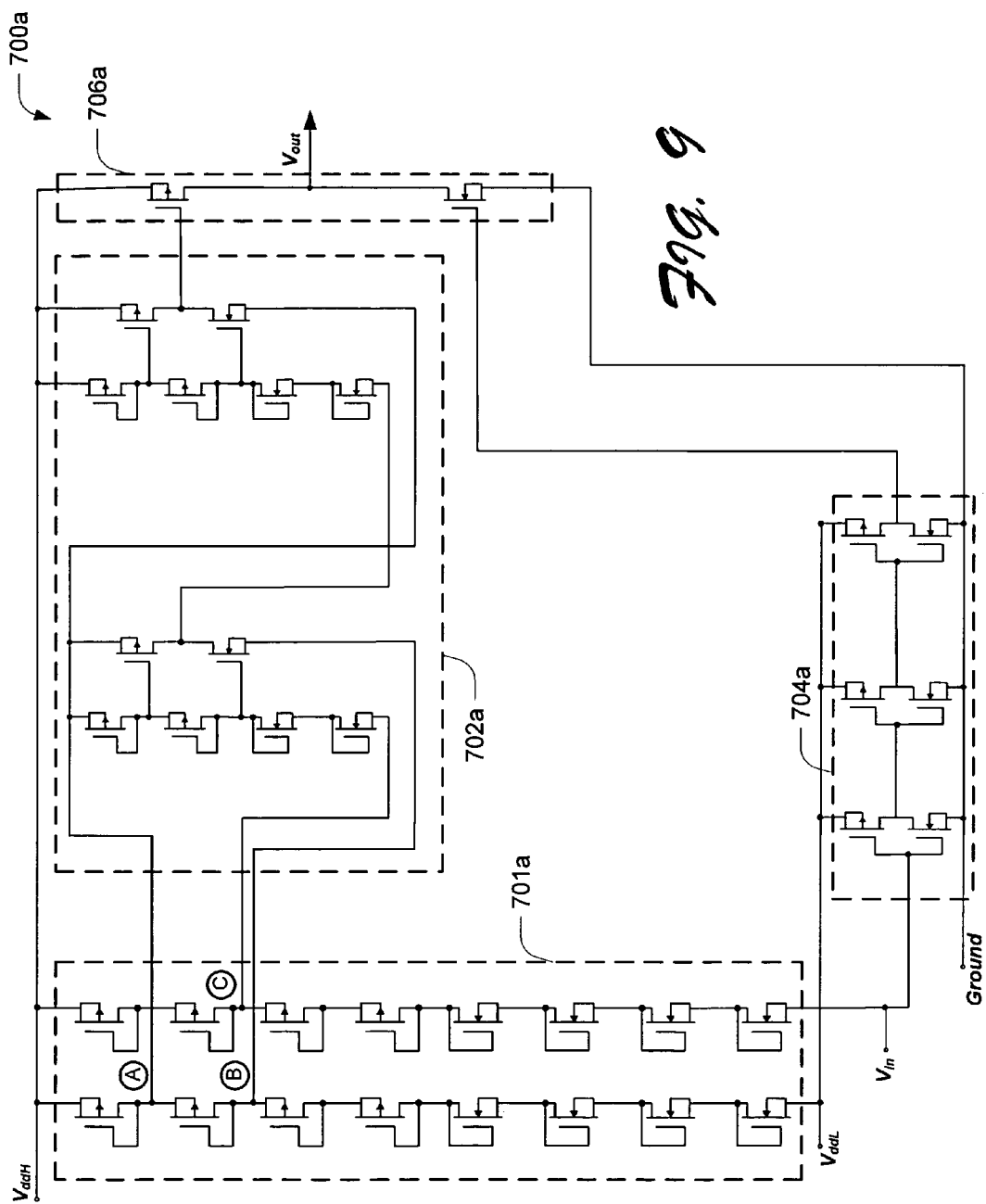
FIG. 9 is a schematic diagram of an exemplary level shifter circuit in accordance with one embodiment.

FIG. 9 shows, generally at 700a, a circuit diagram of an exemplary low voltage to extra high voltage level shifter circuit that employs the FIG. 8 matched translation stack in accordance with one embodiment. In the illustrated and described embodiment, circuit 700a comprises the matched translation stack 701a, along with a high voltage buffer stage 702a coupled to receive the output of the translation stack 701a, a low voltage buffer stage 704a and an output stage 706a coupled with the high voltage and low voltage buffer stages 702a, 704a. In this example, the high voltage buffer stage 702a constitutes a cascaded high voltage buffer stage such as that described in FIGS. 3 and 6 above. Low voltage buffer stage 704a constitutes a cascaded low voltage buffer stage such as that described above in FIG. 4. Additionally, output stage 706a constitutes an output stage such as that described above in FIG. 5. Accordingly, for the sake of brevity the operations of these particular circuits are not described in additional detail.

As noted above, matched translation stack 701a is used to provide biasing for high voltage buffer stage 702a, and as well as to provide the primary logic level translation. After the primary logic level translation or upward shift, high voltage buffer stage 702a performs a secondary or final manipulation of the logic level to the desired level. The outputs of the high and low voltage buffer stages are then provided to output stage 706a for processing that is similar to that described above.

Specifically, in this example, high voltage buffer stage 702a is biased via intermediate node "A" in the first stack of translation stack 701a, and intermediate node "B" in the first stack. The input voltage connection for the first stage in the high voltage buffer stage is provided by intermediate node "C" in the second stack of the translation stack. In the illustrated and described embodiment, the lower of the biasing voltage connections (i.e. intermediate node "B") and the input voltage connection for the first stage of the high voltage buffer stage 702a are taken from corresponding intermediate nodes in the translation stack. The higher of the biasing voltage connections is taken from an intermediate node in first stack that is just above the corresponding intermediate nodes.

The second stage in the high voltage buffer stage 702a is biased by $V_{ddH}$—which is the level to which the shift is desired—and the intermediate node in the first stack of the translation stack that provides the higher of the biasing voltages for the first stage of high voltage buffer stage 702a (i.e. by virtue of intermediate node "A").

When the input voltage $V_{in}$ is high, the two stacks of translation stack 701a match. This means that the control output (i.e. that provided by intermediate node "C") and the lower biasing output (i.e. provided by intermediate node "B") are identical. When $V_{in}$ is low, on the other hand, the control output (i.e. that provided by intermediate node "C") and the lower biasing output (i.e. provided by intermediate node "B") are not the same.

Tapping off the matched translation stack at multiple locations allows the high voltage buffer stage 702a to generate a good control signal over a wide range of input deviations. This control signal, in turn, drives the high voltage portion of output stage 706a. As such, control signals are generated that enable the high voltage buffer stage 702a to efficiently shift the input signal to a high control level over a wide range of input deviation.

The illustrated and described circuit is best utilized shifting from low voltages, e.g. in and around 2.5 volts to extra high voltages, e.g. 28 volts. In the described embodiment, the matched translation stack 701a provides a fairly high first level shift, and then the high voltage buffer stage 702a provides a series of smaller upward shifts to arrive at the desired voltage level shift.

For example, assume that circuit 700a or one like it, is being used to shift to 28 volts from 2.5 volts. When the input signal $V_{in}$ is at 2.5 volts, all of the intermediate node voltages of the rightmost stack of translation stack 701a are going to shift upward in potential, and then when the input signal returns to 0 volts, all of the intermediate nodes of the rightmost stack will drop to a lower potential. What then happens is that as one examines each node of the stack from bottom to top, the amounts that the voltages change at each node decrease. So, for example, the bottom node is going to swing 2.5 volts and the very top node is not going to swing at all. As such, there is somewhat of a linear gradient in the voltage swing as one traverses up the stack. This is one reason why it is undesirable to tap off of the high node on the rightmost stack. Specifically, the high node on the rightmost stack does not meaningfully swing in its potential. Accordingly, tapping off of a lower node of the rightmost stack (in this case, the next lower node) provides enough of a swing in potential to be used as an input to the high voltage buffer stage.

Additionally, it is to be appreciated and understood that this particular design can be utilized to simultaneously shift more than one level. That is, because the high voltage buffer stage 702a is being used to make smaller upward level shifts, the translation stack 701a can be tapped off at multiple voltages. For example, if one desired to shift to 28 volts, one could tap off the second stack at 12, 14, 15 volts and the like.

CONCLUSION

Uses of the above-described circuits include, by way of example and not limitation the following: providing an interface between low voltage integrated circuit technologies and other integrated circuit technologies that operate at higher logic levels, control of electromechanical actuators, control of gas and liquid apertures, control of high pressure propellant apertures, MEMS device control, system-on-chip power management, and power converter feedback and switching. Further, various embodiments can find wide use in extreme environment applications, where the processes used for fabrication of the integrated circuits are chosen specifically for their tolerance to environmental variables, not breakdown voltage. As stated previously, the levels used in these specific applications are not fixed, but can vary as application is needed. Further, these embodiments are particularly well suited for shifting to multiple levels simultaneously. As such, in one application scenario, the circuit can be employed in the context of high voltage stacked transistors, in which shifting to multiple levels simultaneously is desired.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

The invention claimed is:

1. A shifter circuit comprising:
   a matched translation stack comprising at least first and second stacks each of which comprising multiple transistors, the matched translation stack being configured to provide a primary logic level shift between a voltage level away from which a shift is desired ($V_{ddL}$) and a voltage level to which the shift is desired ($V_{ddH}$);
   one or more high voltage buffer stages at least one of which being connected with and biased by the matched translation stack, said at least one high voltage buffer stage comprising:
   multiple transistors arranged in a transistor stack having a plurality of intermediate nodes connecting individual transistors along the stack, the transistor stack being biased by said first stack of the matched translation stack, and being connected to receive an input supplied by said second stack of the matched translation stack; and
   an inverter comprising multiple inputs and an output, individual inverter inputs being connected to a respective intermediate node of the transistor stack;
   a low voltage buffer stage having an input and an output, the input being connected to an input voltage $V_{in}$, and being connected between the voltage level away from which the shifted is desired ($V_{ddL}$) and a lower voltage; and
   an output buffer stage driven by the outputs of the high voltage buffer stage inverter and the low voltage buffer stage.

2. The shifter circuit of claim 1, wherein the matched translation stack comprises p-channel and n-channel devices, and wherein the p-channel devices are connected between the n-channel devices and the voltage level being shifted to.

3. The shifter circuit of claim 1, wherein said at least one high voltage buffer stage is biased by a connection across a transistor that does not constitute the uppermost transistor in the first stack.

4. The shifter circuit of claim 1, wherein the matched translation stack comprises p-channel and n-channel devices, and wherein the p-channel devices are connected between the n-channel devices and the voltage level being shifted to, and wherein said at least one high voltage buffer stage is biased by a connection across a p-channel transistor that does not constitute the uppermost transistor in the first stack.

5. The shifter circuit of claim 1, wherein the inverter comprises p-channel and n-channel devices, and wherein one input of the inverter is connected to an intermediate node between two p-channel devices, and another input of the inverter is connected to a intermediate node between a p-channel device and an n-channel device.

6. The shifter circuit of claim 1, wherein the matched translation stack comprises p-channel and n-channel devices, and wherein the p-channel devices are connected between the n-channel devices and the voltage level being shifted to, and wherein the inverter comprises p-channel and n-channel devices, and wherein one input of the inverter is connected to an intermediate node between two p-channel devices, and another input of the inverter is connected to a intermediate node between a p-channel device and an n-channel device.

7. The shifter circuit of claim 1, wherein said at least one high voltage buffer stage is biased by a connection across a transistor that does not constitute the uppermost transistor in the first stack, and wherein the inverter comprises p-channel and n-channel devices, and wherein one input of the inverter is connected to an intermediate node between two p-channel devices, and another input of the inverter is connected to a intermediate node between a p-channel device and an n-channel device.

8. The shifter circuit of claim 1, wherein the matched translation stack comprises p-channel and n-channel devices, and wherein the p-channel devices are connected between the n-channel devices and the voltage level being shifted to, and wherein said at least one high voltage buffer stage is biased by a connection across a p-channel transistor that does not constitute the uppermost transistor in the first stack, and wherein the inverter comprises p-channel and n-channel devices, and wherein one input of the inverter is connected to an intermediate node between two p-channel devices, and another input of the inverter is connected to a intermediate node between a p-channel device and an n-channel device.

9. The shifter circuit of claim 1, wherein the transistors of the transistor stack comprise gate/drain connected MOSFETs.

10. A shifter circuit comprising:
    a matched translation stack comprising first and second stacks each of which comprising multiple p-channel MOSFETs and n-channel MOSFETs, the first stack being connected between a voltage level to which a shift is desired ($V_{ddH}$) and a voltage level away from which the shift is desired ($V_{ddL}$), the second stack being connected between the voltage level to which a shift is desired ($V_{ddH}$) and an input signal $V_{in}$, the matched translation stack being configured to provide a primary logic level shift;
    multiple cascaded high voltage buffer stages, a first of which being connected with and biased by the first stack of the matched translation stack, said high voltage buffer stages each comprising:
    multiple transistors arranged in a transistor stack having a plurality of intermediate nodes connecting individual transistors along the stack, said multiple transistors being connected to receive, if said high voltage buffer stage is the first high voltage buffer stage, an input supplied by said second stack of the matched translation stack and, if said high voltage buffer stage is not said first high voltage buffer stage, an input provided by an output of a preceding high voltage buffer stage; and an inverter comprising multiple inputs and an output, individual inverter inputs being connected to a respective intermediate node of the transistor stack;

multiple cascaded low voltage buffer stages having an input and an output, a first of the low voltage buffer stages being connected to the input signal $V_{in}$, and being connected between the voltage level away from which the shifted is desired ($V_{ddL}$) and a lower voltage; and an output buffer stage driven by the outputs of the high voltage buffer stage and the low voltage buffer stage.

11. The shifter circuit of claim 10, wherein p-channel MOSFETs of said first and second stacks of said matched translation stack are connected between the n-channel MOSFETs of the corresponding stack and the voltage level being shifted to.

12. The shifter circuit of claim 10, wherein p-channel MOSFETs of said first and second stacks of said matched translation stack are connected between the n-channel MOSFETs of the corresponding stack and the voltage level being shifted to, and wherein inverters of each high voltage buffer stage each comprise p-channel and n-channel MOSFETs.

13. The shifter circuit of claim 10, wherein p-channel MOSFETs of said first and second stacks of said matched translation stack are connected between the n-channel MOSFETs of the corresponding stack and the voltage level being shifted to, and wherein inverters of each high voltage buffer stage each comprise p-channel and n-channel MOSFETs, and wherein, for each transistor stack in each of the high voltage buffer stages:

one input of its associated inverter is connected to an intermediate node between two p-channel MOSFETs, and another input of the inverter is connected to a intermediate node between a p-channel MOSFET and an n-channel MOSFET.

14. The shifter circuit of claim 10, wherein p-channel MOSFETs of said first and second stacks of said matched translation stack are connected between the n-channel MOSFETs of the corresponding stack and the voltage level being shifted to, and wherein inverters of each high voltage buffer stage each comprise p-channel and n-channel MOSFETs, and wherein, for each transistor stack in each of the high voltage buffer stages:

one input of its associated inverter is connected to an intermediate node between two p-channel MOSFETs, another input of the inverter is connected to a intermediate node between a p-channel MOSFET and an n-channel MOSFET, and wherein the said inverter inputs are connected across at least one common p-channel MOSFET.

15. The shifter circuit of claim 10, wherein p-channel MOSFETs of said first and second stacks of said matched translation stack are connected between the n-channel MOSFETs of the corresponding stack and the voltage level being shifted to, and wherein inverters of each high voltage buffer stage each comprise p-channel and n-channel MOSFETs, and wherein, for each transistor stack in each of the high voltage buffer stages:

one input of its associated inverter is connected to an intermediate node between two p-channel MOSFETs, another input of the inverter is connected to a intermediate node between a p-channel MOSFET and an n-channel MOSFET, and wherein the input of the inverter's p-channel MOSFET is connected to an intermediate node between two p-channel MOSFETs.

16. The shifter circuit of claim 10, wherein p-channel MOSFETs of said first and second stacks of said matched translation stack are connected between the n-channel MOSFETs of the corresponding stack and the voltage level being shifted to, and wherein inverters of each high voltage buffer stage each comprise p-channel and n-channel MOSFETs, and wherein, for each transistor stack in each of the high voltage buffer stages:

one input of its associated inverter is connected to an intermediate node between two p-channel MOSFETs, another input of the inverter is connected to a intermediate node between a p-channel MOSFET and an n-channel MOSFET, and wherein the input of the inverter's p-channel MOSFET is connected to the intermediate node between the two p-channel MOSFETs, and wherein the input of the inverter's n-channel MOSFET is connected between the intermediate node between the p-channel MOSFET and the n-channel MOSFET.

17. A method comprising:

supplying a voltage level away from which a shift is desired ($V_{ddL}$);

supplying a voltage level to which a shift is desired ($V_{ddH}$);

supplying an input voltage $V_{in}$; and shifting the input voltage, using said voltage levels and a circuit comprising:

a matched translation stack comprising at least first and second stacks each of which comprising multiple transistors, the matched translation stack being configured to provide a primary logic level shift between the voltage level away from which the shift is desired ($V_{ddL}$) and the voltage level to which the shift is desired ($V_{ddH}$);

one or more high voltage buffer stages at least one of which being connected with and biased by the matched translation stack, said at least one high voltage buffer stage comprising:

multiple transistors arranged in a transistor stack having a plurality of intermediate nodes connecting individual transistors along the stack, the transistor stack being biased by said first stack of the matched translation stack, and being connected to receive an input supplied by said second stack of the matched translation stack; and an inverter comprising multiple inputs and an output, individual inverter inputs being connected to a respective intermediate node of the transistor stack;

a low voltage buffer stage having an input and an output, the input being connected to the input voltage $V_{in}$, and being connected between the voltage level away from which the shifted is desired ($V_{ddL}$) and a lower voltage; and an output buffer stage driven by the outputs of the high voltage buffer stage inverter and the low voltage buffer stage.

18. The method of claim 17, wherein said high voltage buffer stage comprises multiple cascaded high voltage buffer stages.

19. The method of claim 17, wherein said low voltage buffer stage comprises multiple low voltage buffer stages cascaded together.

* * * * *

UNITED STATES PATENT AND TRADEMARK OFFICE
CERTIFICATE OF CORRECTION

PATENT NO. : 7,030,654 B2 Page 1 of 1
APPLICATION NO. : 10/920630
DATED : April 18, 2006
INVENTOR(S) : Erik J. Mentze et al.

It is certified that error appears in the above-identified patent and that said Letters Patent is hereby corrected as shown below:

Column 1, line 9, add the following paragraph:

GOVERNMENT SUPPORT

--This invention was funded in part by the NASA Idaho EPSCoR under contract NCC5-577. The United States Government has certain rights in the invention.--

Signed and Sealed this

Fifth Day of September, 2006

JON W. DUDAS
*Director of the United States Patent and Trademark Office*